(12) United States Patent
Kim et al.

(10) Patent No.: US 12,354,640 B2
(45) Date of Patent: Jul. 8, 2025

(54) MEMORY DEVICE REFRESH OPERATIONS

(71) Applicant: SAMSUNG ELECTRONICS CO., LTD., Suwon-si (KR)

(72) Inventors: Dongha Kim, Suwon-si (KR); Hyunki Kim, Suwon-si (KR); Sungchul Park, Suwon-si (KR); Ju-Seop Park, Suwon-si (KR); Dongsu Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 350 days.

(21) Appl. No.: 18/171,121

(22) Filed: Feb. 17, 2023

(65) Prior Publication Data

US 2024/0038288 A1 Feb. 1, 2024

(30) Foreign Application Priority Data

Jul. 28, 2022 (KR) .................. 10-2022-0094036

(51) Int. Cl.
*G11C 11/406* (2006.01)

(52) U.S. Cl.
CPC .. *G11C 11/40622* (2013.01); *G11C 11/40603* (2013.01); *G11C 11/40611* (2013.01); *G11C 11/40615* (2013.01)

(58) Field of Classification Search
CPC ........ G11C 11/40622; G11C 11/40603; G11C 11/40611; G11C 7/24; G11C 11/4078; G11C 7/02; G11C 11/408; G11C 11/406; G11C 11/4076; G06F 21/79; G06F 3/0659; G06F 7/588
See application file for complete search history.

(56) References Cited

U.S. PATENT DOCUMENTS

| | | | |
|---|---|---|---|
| 9,431,085 B2 | 8/2016 | Greenberg et al. | |
| 9,589,606 B2 | 3/2017 | Lin et al. | |
| 10,102,886 B2 | 10/2018 | Crawford et al. | |
| 10,573,370 B2 | 2/2020 | Ito et al. | |
| 2018/0114561 A1 | 4/2018 | Fisch et al. | |
| 2020/0294576 A1 | 9/2020 | Brown et al. | |
| 2021/0358539 A1 | 11/2021 | Cowles et al. | |
| 2022/0068364 A1* | 3/2022 | Ayyapureddi | G11C 11/4082 |
| 2022/0122652 A1 | 4/2022 | Brandl et al. | |

FOREIGN PATENT DOCUMENTS

KR 10-2385443 4/2022

OTHER PUBLICATIONS

Woo et al., "Mitigating Row-hammering by Adapting the Probability of Additional Row Refresh," Presented at Proceedings of the 2019 IEEE 4th International Conference on Technology, Informatics, Management, Engineering & Environment (TIME-E), Bali, Indonesia, Nov. 13-15, 2019, 6 pages.

* cited by examiner

*Primary Examiner* — Jay W. Radke
(74) *Attorney, Agent, or Firm* — Fish & Richardson P.C.

(57) ABSTRACT

In a memory device, a control circuit detects determines an aggressor row address, indicating an aggressor row of a memory cell array, at a random time. The aggressor row address or a value derived from the aggressor row address is stored in a queue. The control circuit controls a refresh operation of one or more victim rows based on the aggressor row address in response to a targeted refresh command.

20 Claims, 12 Drawing Sheets

MEMORY DEVICE REFRESH OPERATIONS

CROSS-REFERENCE TO RELATED APPLICATION

This application is based on and claims priority to Korean Patent Application No. 10-2022-0094036 filed in the Korean Intellectual Property Office on Jul. 28, 2022, the entire contents of which are incorporated herein by reference.

BACKGROUND

(a) Field

The disclosure relates to memory devices and refresh methods thereof.

(b) Description of the Related Art

A volatile memory device such as a dynamic random-access memory (DRAM) may store data by storing charges to a capacitor of a memory cell, and may read data by determining the charges stored in the capacitor. Because the charges stored in the capacitor leak over time, the memory device may periodically perform a refresh operation.

A memory controller of the memory device may access an address of the memory device randomly, and may access a particular address frequently or intensively. As the density of memory cells in the memory device increases, due to a voltage distribution of a row, the influence of charges in memory cells of an adjacent rows may increase. In particular, when an attack of intensively accessing a certain row is performed, due to a voltage of an active state of the certain row, data stored in memory cells of an adjacent row may be changed. This phenomenon is called "rowhammer".

SUMMARY

Some embodiments may provide a memory device or a refresh method for responding to an attack.

According to some embodiments, a memory device including a memory cell array, a match signal generating circuit, a queue, and a control circuit may be provided. The memory cell array may include a plurality of rows, and the match signal generating circuit may randomly generate a match signal The control circuit may detect an aggressor row address indicating an aggressor row among the plurality of rows at a timing of the match signal when the match signal is generated, store the aggressor row address in the queue, and control a refresh based on the aggressor row address in response to a targeted refresh command.

According to some embodiments, there may be provided a memory device including a memory cell array, a match signal generating circuit, and a command control circuit. The memory cell array may include a plurality of rows, and the match signal generating circuit may randomly generate a match signal. The command control circuit may randomly output a normal refresh command for a normal refresh operation and a targeted refresh command for a refresh operation of a row indicated by a victim row address among the plurality of rows, based on the match signal.

According to some embodiments, a refresh method of a memory device including a memory cell array including a plurality of rows may be provided. The refresh method may include determining a timing randomly, detecting an aggressor row address indicating an aggressor row from among the plurality of rows at the timing, storing the aggressor row address in a queue, determining a victim row address based on the aggressor row address, and refreshing a row indicated by the victim row address from among the plurality of rows in response to a refresh command.

DETAILED DESCRIPTION

Figure 1:
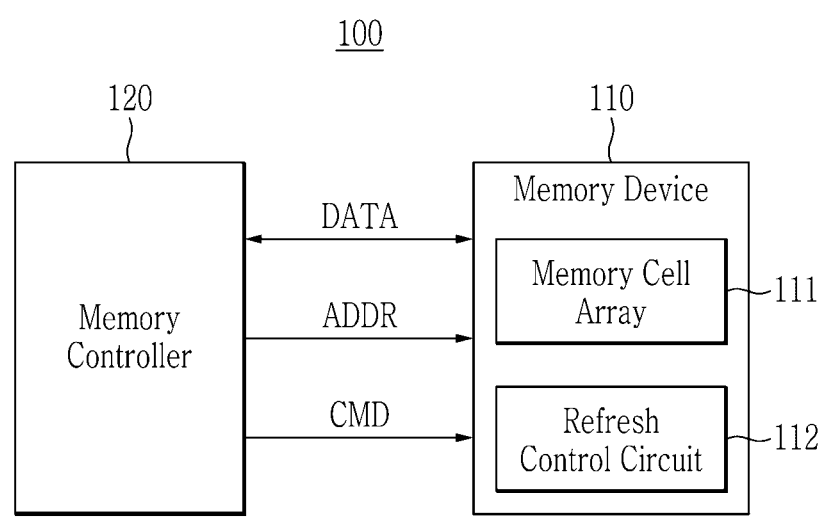
FIG. 1 is an example block diagram of a memory system according to some embodiments.

In the following detailed description, only certain embodiments according to the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification. The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation.

To counter the effects of rowhammer attacks, refresh operations can be performed on victim rows before data stored in memory cells of the victim rows has been overly modified by a rowhammer attack. In the absence of specific knowledge of the identities of victim rows, an example approach is to perform refresh operations on all rows of the memory cell array at a high frequency. Refresh operations, though, may be costly in terms of energy usage and timing requirements, and so in some cases it may be desirable to limit the number of refresh operations performed, e.g., by determining (as victim rows) particular row(s) that are likely to be targets of the rowhammer attack and performing targeted refresh operations on those rows. However, when the timing of victim row determination is predetermined/ regular, sophisticated rowhammer attacks may take advantage of the known timing to prevent accurate identification of targeted rows. For example, a target row may be targeted immediately after a first victim row is determined, and another, "decoy" row may subsequently be targeted prior to determination of a second victim row, so that the decoy row is determined as the second victim row and refreshed while the actual target row is not refreshed. Some embodiments according to this disclosure determine victim row(s) with randomized timing, making it more difficult for attackers to take advantage of time-based rowhammer attacks to avoid refresh operations on target rows. Moreover, in some embodiments, synchronized rowhammer attacks are made more difficult by randomizing the timing of performing a targeted refresh operation or a normal refresh operation.

FIG. 1 is an example block diagram of a memory system according to some embodiments.

Referring to FIG. 1, a memory system 100 may include a memory device 110 and a memory controller 120. In some embodiments, the memory device 110 and the memory controller 120 may be connected through a memory interface to send and receive signals through the memory interface.

The memory device 110 may include a memory cell array 111 and a refresh control circuit 112. The memory cell array 111 may include a plurality of memory cells defined by a plurality of rows and a plurality of columns. In some embodiments, the rows may be defined by word lines and the columns may be defined by bit lines. The refresh control circuit 112 may determine an aggressor row from among the rows, determine a row address (referred to as a "victim row address") of a victim row to be refreshed based on a row address (referred to as an "aggressor row address") of the aggressor row, and output the victim row address and/or otherwise control operations of the memory device 110 to perform a refresh operation on the victim row. In some embodiments, the aggressor row may be a rowhammer aggressor row, and the victim row may be a row to be protected from rowhammer attacks. In some embodiments, the refresh control circuit 112 may determine the aggressor row address at a randomly determined timing.

The memory controller 120 may control a memory operation of the memory device 110 by providing a signal to the memory device 110. The signal may include commands CMD and/or addresses ADDR. In some embodiments, the memory controller 120 may provide the command CMD and the address ADDR to the memory device 110 to access the memory cell array 111 and control a memory operation such as read or write. Data may be transferred from the memory cell array 111 to the memory controller 120 according to a read operation, and data may be transferred from the memory controller 120 to the memory cell array 111 according to a write operation.

The command CMD may include an activate command, a read/write command, and/or a refresh command. In some embodiments, the command CMD may further include a precharge command. The activate command may be a command for switching a target row of the memory cell array 111 to an active state in order to write data to or read data from the target row the memory cell array 111. A memory cell of the target row may be activated (e.g., driven) in response to the activate command. The read/write command may be a command for performing the read or write operation on the target memory cell of the row switched to the active state. The refresh command may be a command for performing a refresh operation in the memory cell array 111. In some embodiments, the refresh control circuit 112 may output a normal refresh command or a targeted refresh command in response to the refresh command. The targeted refresh command may be a refresh command that instructs an operation to refresh a victim row. The normal refresh command may be a refresh command instructing a normal refresh operation, for example, an operation for sequentially refreshing rows of the memory cell array 111. The normal refresh operation can be a refresh operation that is not based on an aggressor row determination.

In some embodiments, the memory controller 120 may access the memory device 110 in response to a request from a host external to the memory system 100. The memory controller 120 may communicate with the host using various protocols.

The memory device 110 may be a storage device based on a semiconductor device. In some embodiments, the memory device 110 may include a DRAM device. In some embodiments, the memory device 110 may include other volatile or non-volatile memory devices for which the refresh operation is used.

Figure 2:
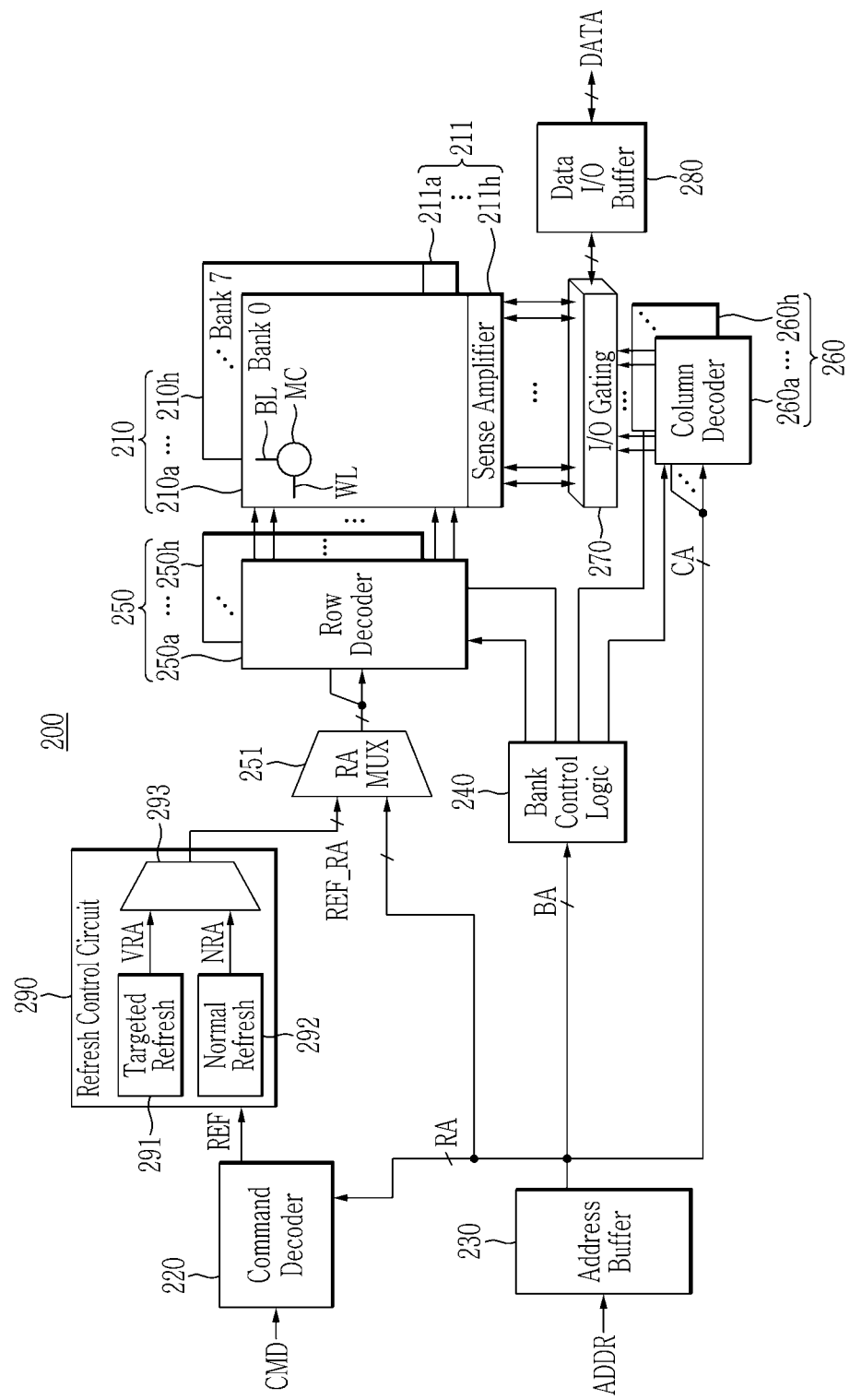
FIG. 2 is an example block diagram of a memory device according to some embodiments.

FIG. 2 is an example block diagram of a memory device according to some embodiments.

Referring to FIG. 2, a memory device 200 may include a memory cell array 210, a sense amplifier 211, a command decoder 220, an address buffer 230, a row decoder 250, a column decoder 260, an input/output (I/O) gating circuit 270, a data I/O buffer 280, and a refresh control circuit 290.

The memory cell array 210 may include a plurality of memory cells MC. In some embodiments, the memory cell array 210 may include a plurality of memory banks 210a to 210h. Although FIG. 2 shows eight memory banks (BANK0 to BANK7) 210a to 210h, the number of memory banks is not limited thereto. Each of the memory banks 210a to 210h may include a plurality of rows, a plurality of columns, and a plurality of memory cells MC arranged at intersections of the plurality of rows and the plurality of columns. In some embodiments, the rows may be defined by a plurality of wordlines WL, and the columns may be defined by a plurality of bitlines BL.

The command decoder 220 may generate a control signal so that the memory device 200 may perform a read operation, a write operation, or a refresh operation. The command decoder 221 may generate a refresh command REF by decoding a command CMD received from a memory controller (e.g., 120 in FIG. 1).

The address buffer 230 may receive an address ADDR provided by the memory controller 120. The address ADDR may include a row address RA indicating a row of the memory cell array 210 and a column address CA indicating a column of the memory cell array 210. The row address RA may be provided to the row decoder 250, and the column address CA may be provided to the column decoder 260. The row address RA may be provided to the refresh control circuit 290 through the command decoder 220 or may be provided directly to the refresh control circuit 290. In some embodiments, the row address RA may be provided to the row decoder 250 via a row address multiplexer 251. In some embodiments, the address ADDR may further include a bank address BA indicating a memory bank.

In some embodiments, the memory device 200 may further include the row address multiplexer 251. The row address multiplexer 251 may receive the row address RA from the address buffer 230 and a row address REF_RA to be refreshed from the refresh control circuit 290. The row address multiplexer 251 may selectively output the row address RA received from the address buffer 230 and the row address REF_RA received from the refresh control circuit 290 to the row decoder 250.

The row decoder 250 may select a row to be activated from among the plurality of rows of the memory cell array 210 based on the row address RA or REF_RA. The row decoder 250 may apply a driving voltage to a wordline corresponding to the row to be activated. In some embodiments, the plurality of row decoders 250a to 250h respectively corresponding to the plurality of memory banks 210a to 210h may be provided.

The column decoder 260 may select a column to be activated from among the plurality of columns of the memory cell array 210 based on the column address CA. The column decoder 260 may activate the sense amplifier 211 corresponding to the column address CA through the I/O gating circuit 270. In some embodiments, the plurality of column decoders 260a to 260h respectively corresponding to the plurality of memory banks 210a to 210h may be provided. In some embodiments, the I/O gating circuit 270 may gate I/O data, and may include a data latch that stores data read from the memory cell array 210 and a write driver that writes data to the memory cell array 210. The data read from the memory cell array 210 may be sensed by the sense amplifier 211 and stored in the I/O gating circuit 270 (e.g., the data latch). In some embodiments, a plurality of sense amplifiers 211a to 211h respectively corresponding to the plurality of memory banks 210a to 210h may be provided.

In some embodiments, the memory device 200 may further include the bank control logic 240 that generates a bank control signal in response to the bank address BA. In response to the bank control signal, a row decoder 250 corresponding to the bank address BA among the row decoders 250a to 250h may be activated, and a column decoder 260 corresponding to the bank address BA among the column decoders 260a to 260h may be activated.

In some embodiments, the data read from the memory cell array 210 (e.g., the data stored in the data latch) may be provided to the memory controller 120 via the data I/O buffer 280. The data to be written to the memory cell array 210 may be provided from the memory controller 120 to the data I/O buffer 280, and the data provided to the data I/O buffer 280 may be provided to the I/O gating circuit 270.

The refresh control circuit 290 may transfer the row address REF_RA to be refreshed to the row decoder 250 in response to the refresh command REF. In some embodiments, the refresh control circuit 290 may include a targeted refresh control circuit 291, a normal refresh control circuit 292, and a refresh row address selector 293. The targeted refresh control circuit 291 may detect an aggressor row address at randomly determined timing, calculate a victim row address VRA based on the aggressor row address, and output the victim row address VRA in response to a targeted refresh command. The targeted refresh command may be a rowhammer refresh command. The normal refresh control circuit 292 may calculate a row address NRA on which a normal refresh operation is to be performed, and may output the row address NRA in response to a normal refresh command. The refresh row address selector 293 may selectively output the row address VRA from the targeted refresh control circuit 291 or the row address NRA from the normal refresh control circuit 292. In some embodiments, the refresh row address selector 293 may output the row address NRA from the normal refresh control circuit 292 as the refresh row address REF_RA in response to the normal refresh command, and may output the row address VRA from the targeted refresh control circuit 291 as the refresh row address REF_RA in response to the targeted refresh command. In some embodiments, the refresh control circuit 290 may randomly generate the targeted refresh command or the normal refresh command in response to the refresh command REF.

Figure 3:
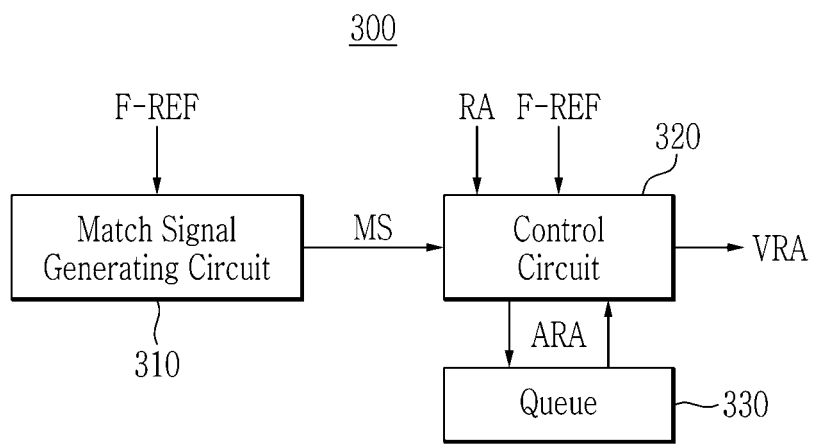
FIG. 3 is an example block diagram illustrating a refresh control circuit of a memory device according to some embodiments.
Figure 4:
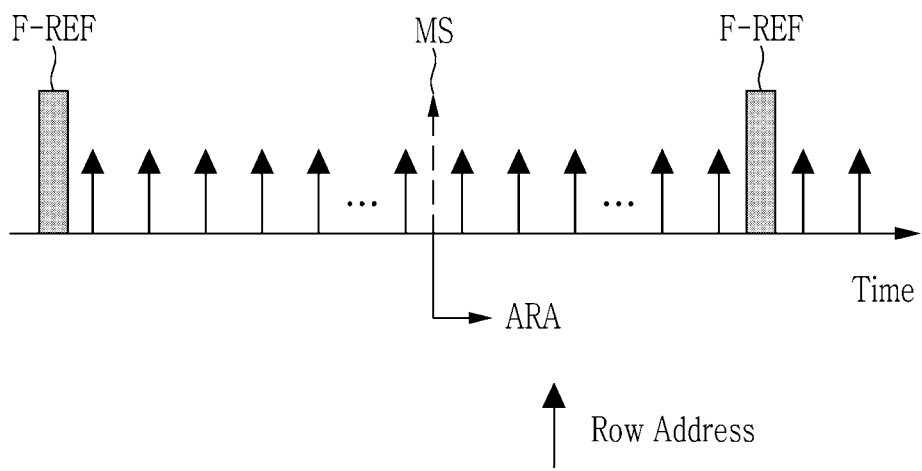
FIG. 4 is an example drawing showing an operation of a refresh control circuit shown in FIG. 3.
Figure 5:
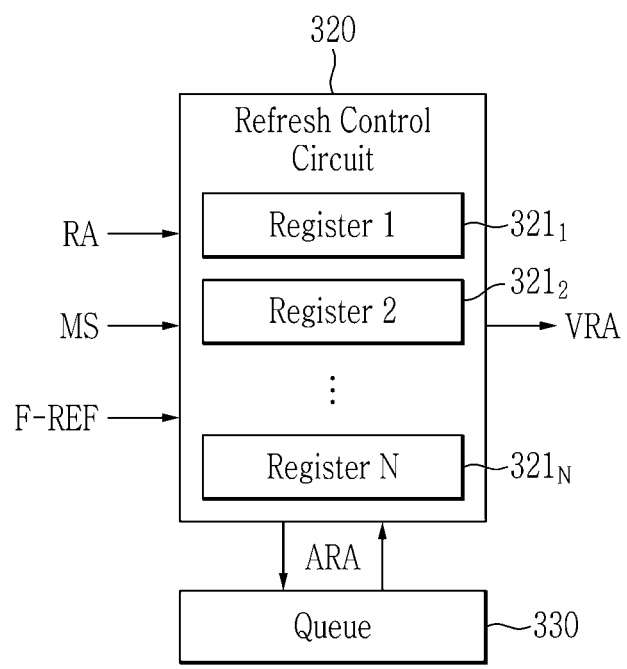
FIG. 5 is an example drawing an example of a control circuit in a refresh control circuit shown in FIG. 3.

FIG. 3 is an example block diagram showing a refresh control circuit of a memory device according to some embodiments, FIG. 4 is an example drawing showing an operation of a refresh control circuit shown in FIG. 3, and FIG. 5 is an example drawing an example of a control circuit in a refresh control circuit shown in FIG. 3. In some embodiments, a refresh control circuit 300 shown in FIG. 3 to FIG. 5 may correspond to a targeted refresh control circuit (e.g., 291 in FIG. 2).

Referring to FIG. 3, the refresh control circuit 300 may include a match signal generating circuit 310, a control circuit 320, and a queue 330.

Referring to FIG. 3 and FIG. 4, the match signal generating circuit 310 may randomly generate a match signal MS. In some embodiments, a probability with which the match signal MS is generated may be set such that the match signal MS may be generated one or more times during a period between two consecutive targeted refresh commands F-REF.

The control circuit 320 may detect an aggressor row (e.g., aggressor row address ARA) at a timing of the match signal MS, and store the aggressor row address ARA in the queue 330. The timing of the match signal MS may be, for example, a time point at which the match signal MS is generated or a time point at which the control circuit 320 receives the match signal MS. The queue 330 may be implemented as, for example, a flip-flop, a latch, a buffer circuit, or a static random-access memory (SRAM), but is not limited thereto.

The control circuit 320 may receive a row address (hereinafter referred to as an "incoming row address") RA of a row to be activated in a memory cell array (e.g., 111 in FIG. 1) from a memory controller (e.g., 120 in FIG. 1), and count the incoming row address RA. In some embodiments, the control circuit 320 may count the incoming row address RA that is received along with the activate command ACT. The control circuit 320 may detect the aggressor row address ARA based on count values of row addresses at the timing of the match signal MS. In some embodiments, the control circuit 320 may determine a row address having a largest count value at the timing of the match signal MS as the aggressor row address ARA. The control circuit 320 may store the determined aggressor row address ARA in the queue 330 and continue to count an incoming row address RA even after the timing of the match signal MS.

In some embodiments, in addition to storing the aggressor row address in the queue, one or more values derived from the aggressor row address can be stored. For example, as described herein, the aggressor row address is indicative of one or more victim row addresses, such as victim rows adjacent to the aggressor row. Accordingly, in some embodiments, address(es) of the victim row(s), derived from the aggressor row address, are stored in the queue; the stored victim row address(es) can be used to control a refresh operation in response to a targeted refresh command; and the aggressor row address itself need not be stored. Other value(s) based on the determined addressor row address, the value(s) indicative of one or more rows on which to perform a targeted refresh operation, can additionally be stored.

The control circuit 320 may control a refresh based on the aggressor row address ARA stored in the queue 330 in response to a targeted refresh command F-REF. The control circuit 320 may determine a victim row (e.g., victim row address VRA) based on the aggressor row address ARA, and output the victim row address VRA in response to the targeted refresh command F-REF. In some embodiments, when no match signal MS is generated during a period between a timing of a previous targeted refresh command F-REF and a timing of a current targeted refresh command F-REF, the control circuit 320 may detect the aggressor row address ARA at the timing of the targeted refresh command F-REF. In some embodiments, the control circuit 320 may determine a row address having a largest count value at the timing of the targeted refresh command F-REF as the aggressor row address ARA. The timing of the targeted refresh command F-REF may be, for example, a time point at which the targeted refresh command F-REF occurs or a time point at which the control circuit 320 receives the targeted refresh command F-REF.

The control circuit 320 may determine a row adjacent to the aggressor row as the victim row. In some embodiments, the victim row may include a predetermined number of rows physically adjacent to the aggressor row. For example, when the aggressor row is the $m^{th}$ row and the predetermined number is two, the victim row may include the $(m+1)^{th}$ row and the $(m-1)^{th}$ row. For example, when the aggressor row is the $m^{th}$ row and the predetermined number is four, the victim row may include the $(m+2)^{th}$ row, the $(m+1)^{th}$ row, the $(m-1)^{th}$ row, and $(m-2)^{th}$ row.

Referring to FIG. 5, in some embodiments, the control circuit 320 may include a plurality of registers $321_1$, $321_2$, ... $321_N$ to count the incoming row address RA. Here, N is an integer greater than or equal to two. Each of the registers $321_1$-$321_N$ may store an incoming row address RA. When there is a register $321_i$ in which the incoming row address RA hits (e.g., a register $321_i$ that stores the same row address as the incoming row address RA) among the registers $321_1$-$321_N$, the control circuit 320 may increase a count value of the register $321_i$ by a predetermined number (e.g., one). Here, i is an integer between 1 and N. In some embodiments, the control circuit 320 may increase the count value with storing the incoming row address RA in the register $321_i$ again, or without storing the incoming row address RA in the register $321_i$ again. When there is no register in which the incoming row address RA hits but an empty register $321_j$ exists, the control circuit 320 may store the incoming row address RA in the empty register $321_j$, and increase a count value of the register $321_j$ from an initial value (e.g., zero) by the predetermined number (e.g., one). Here, j is an integer between 1 and N.

When there is no register in which the incoming row address RA hits and there is no empty register, the control circuit 320 may determine a register $321_k$ to be replaced among the registers $321_1$-$321_N$ according to a predetermined replacement algorithm. Here, k is an integer between 1 and N. In some embodiments, the replacement algorithm may include, for example, a space saving algorithm but is not limited thereto. When the space saving algorithm is used, the control circuit 320 may determine the register $321_k$ having a smallest count value among the registers $321_1$-$321_N$ as the register to be replaced, replace a row address stored in the register $321_k$ with the incoming row address RA, and may increase a count value of the register $321_k$ by the predetermined number (e.g., one).

The control circuit 320 may detect the row address stored in a register having a largest count value among the registers $321_1$-$321_N$ as the aggressor row address ARA at the timing of the match signal MS, and store the aggressor row address ARA in the queue 330.

For example, an attack pattern in which row addresses having a regular pattern are repeatedly input may be used for a rowhammer attack. If the number of registers $321_1$-$321_N$ is less than the number of row addresses used for the regular pattern, the row address stored in the registers $321_1$-$321_N$ may change each time the regular pattern is repeated. Therefore, when detecting the aggressor row address based on the row addresses stored in the register $321_1$-$321_N$ at a fixed time point (for example, the timing of the targeted refresh command), the same row address may be omitted when the aggressor row address is detected. As a result, a specific row address among the row addresses of the regular pattern may not be detected as the aggressor row address. According to the above-described embodiments, detecting the aggressor row address at the timing of the match signal MS that is randomly generated may randomly change the row address that is omitted when the aggressor row address is detected, thereby preventing the specific row address from being always omitted.

Further, according to the above-described embodiments, since incoming row addresses that are input after the match signal MS is generated may be continuously counted (e.g., counting is performed after the match signal and at least before the targeted refresh command), row addresses of an attack pattern can be continuously counted even if the attack pattern is input in synchronization with the refresh command F-REF. Therefore, the refresh control circuit according to the above-described embodiments can also respond to the attack pattern input in synchronization with the refresh command F-REF.

Figure 6:
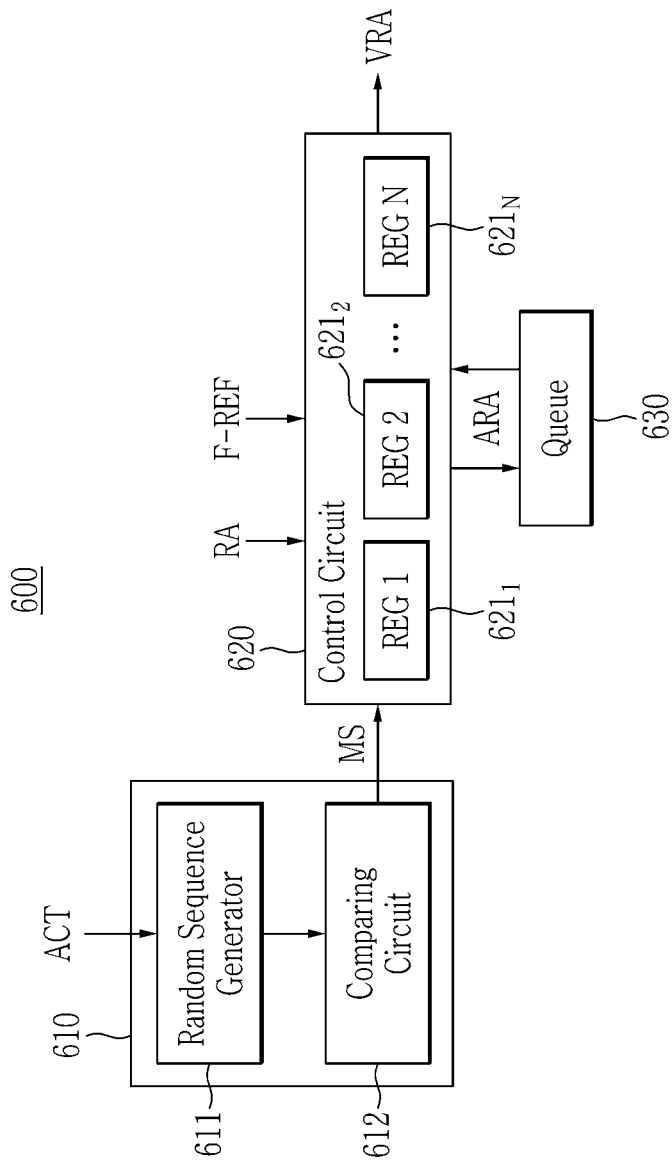
FIG. 6 is an example block diagram illustrating a refresh control circuit of a memory device according to some embodiments.
Figure 7:
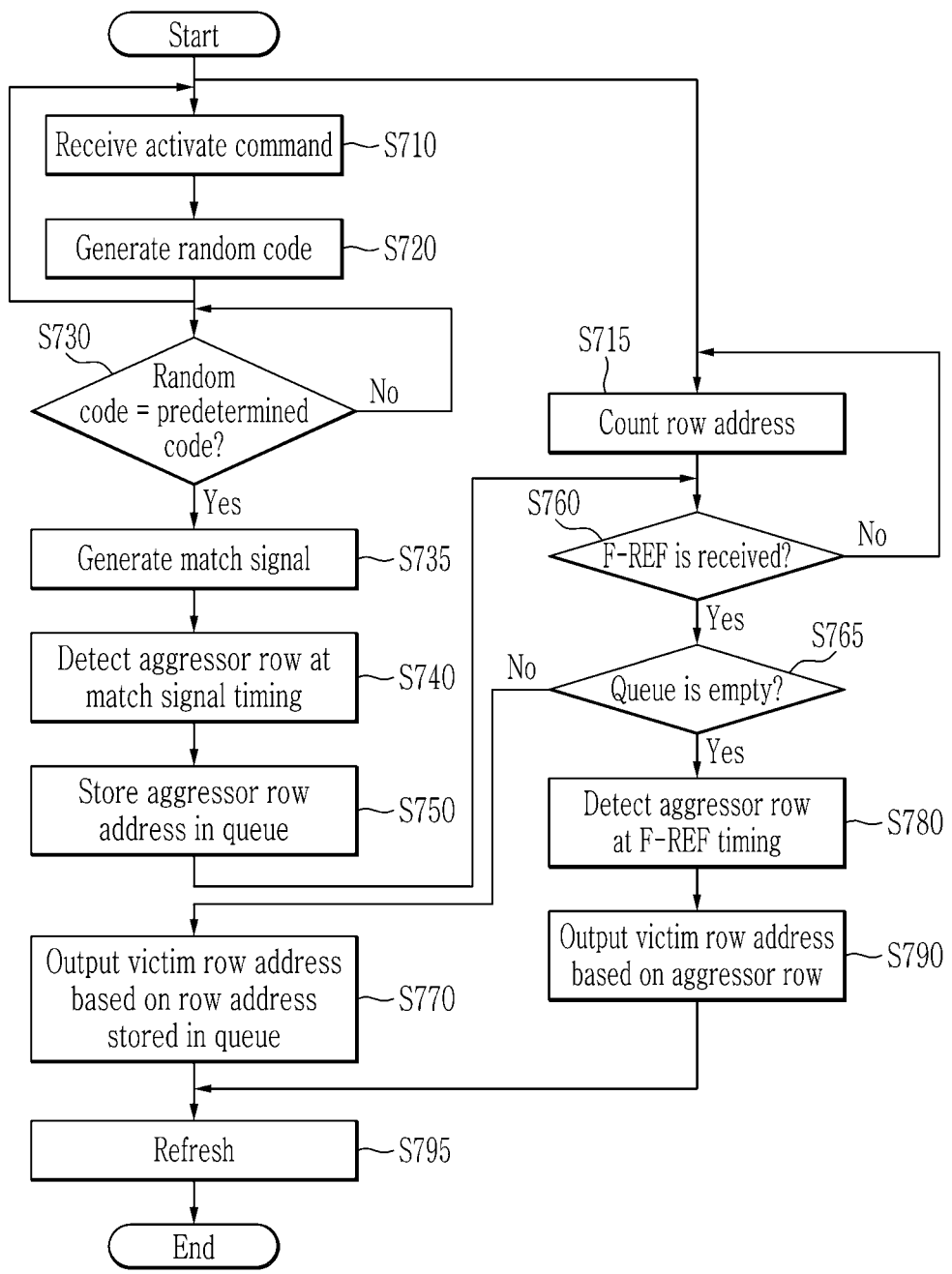
FIG. 7 is an example flowchart showing an operation of a refresh control circuit shown in FIG. 6.

FIG. 6 is an example block diagram showing a refresh control circuit of a memory device according to some embodiments, and FIG. 7 is an example flowchart showing an operation of a refresh control circuit shown in FIG. 6. In some embodiments, a refresh control circuit 600 shown in FIG. 6 and FIG. 7 may correspond to a targeted refresh control circuit (e.g., 291 in FIG. 2).

Referring to FIG. 6, the refresh control circuit 600 may include a match signal generating circuit 610, a control circuit 620, and a queue 630. The match signal generating circuit 610 may include a random sequence generator 611 and a comparing circuit 612. In some embodiments, the control circuit 620 may include a plurality of registers $621_1$, $621_2$, ... $621_N$ as described with reference to FIG. 5.

Referring to FIG. 6 and FIG. 7, the random sequence generator 611 may generate a random code at S720. The random code may include a random number or a pseudo-random number. In some embodiments, the random code may be a pseudorandom binary sequence (PRBS). For example, the random sequence generator 611 may be implemented as linear-feedback shift registers. In some embodiments, upon receiving a predetermined command from a memory controller (e.g., 120 in FIG. 1) at S710, the random sequence generator 611 may generate the random code in response to the predetermined command at S720. The predetermined command may be an activate command ACT. In this case, the random sequence generator 611 may generate the random code each time receiving the activate command ACT.

The comparing circuit 612 may compare the random code generated by the random sequence generator 611 with a predetermined code (e.g., a predetermined binary code) at S730, and output a match signal MS when the random code matches (e.g., is the same as) the predetermined code match at S735.

The foregoing and other embodiments described herein in relation to "match" signals, and "match signal generating" circuits are merely examples. In various embodiments, various methods and/or combinations of circuit(s) can be used to determine or provide a random time at which the aggressor row address is determined (S740). For example, in some embodiments, when a refresh operation is performed, a random time duration is obtained (e.g., a random time duration obtained within a predetermined range according to a distribution, such as a uniform distribution), and a next aggressor row address is determined the random time duration after the refresh operation. Various other suitable random timing schemes are also within the scope of this disclosure. Accordingly, the match signal is an example of a "detection timing signal," because the aggressor row address is detected at the timing of the detection timing signal. Moreover, the "match signal generating circuit" is an example of a "random timing generation circuit," because the circuit is configured to provide one or more signals based on which, and/or in response to which, the random time is determined.

For example, in some embodiments, a random sequence generation circuit is configured to generate a random code, and a comparison circuit is configured to determine whether the random code satisfies a condition. If the condition is satisfied, the detection timing signal is output. For example, the condition can be that the random code matches a predetermined binary code, as described above for the example of the comparing circuit 612. Other conditions can include, but are not limited to, for example, that the random code is greater than a threshold value, less than a threshold value, and/or satisfies one or more pattern(s).

The control circuit 620 may count an incoming row address RA at S715 each time the incoming row address RA is input together with the activate command ACT. In some embodiments, when there is a register $621_i$ in which the incoming row address RA hits among the registers $621_1$-$621_N$, the control circuit 620 may increase a count value of the register $621_1$ by a predetermined number (e.g., one). When there is no register in which the incoming row address hits but an empty register $621_j$ exists, the control circuit 620 may store the incoming row address RA in the empty register $621_j$, and increase a count value of the register $621_j$ from an initial value (e.g., zero) by the predetermined number (e.g., one). When there is no register in which the incoming row address RA hits and there is no empty register, the control circuit 620 may determine a register $621_k$ to be replaced among the registers $621_1$-$621_N$ according to a predetermined replacement algorithm, replace a row address stored in the register $621_k$ with the incoming row address RA, and increase a count value of the register $621_k$ by the predetermined number (e.g., one).

The control circuit 620 may detect an aggressor row (e.g., aggressor row address ARA) based on count values of row addresses at a timing of the match signal MS at S740. In some embodiments, the control circuit 620 may detect a row address having a largest count value (e.g., a row address stored in a register having the largest count value) at the timing of the match signal MS as the aggressor row address ARA. The control circuit 620 may store the detected aggressor row address ARA in the queue 630 at S750. On the other hand, the control circuit 620 may continue to count the incoming row addresses input together with the activate command ACT regardless of the detection of the aggressor row address ARA at S715.

When receiving a targeted refresh command F-REF at S760, the control circuit 620 may determine whether the aggressor row address ARA is stored in the queue 630 in response to the targeted refresh command F-REF at S765. When the aggressor row address ARA is stored in the queue 630 at S765, the control circuit 620 may output a victim row address VRA that is determined based on the aggressor row address ARA stored in the queue 630 at S770. The control circuit 620 may empty the queue 630 after outputting the victim row address VRA from the queue 630. In some embodiments, the control circuit 620 may determine the victim row address VRA based on the aggressor row address ARA stored in the queue 630 when receiving the targeted refresh command F-REF. In some other embodiment, the control circuit 620 may determine the victim row address VRA based on the aggressor row address ARA after storing the aggressor row address ARA in the queue 630. In some embodiments, the control circuit 620 may determine a row address of a row (e.g., a victim row) adjacent to the aggressor row indicated by the aggressor row address ARA stored in the queue 630 as the victim row address VRA.

In some embodiments, after storing the aggressor row address ARA in the queue 630, if the match signal MS is generated again before the targeted refresh command F-REF is received, the control circuit 620 may ignore the corresponding match signal MS and not store the aggressor row address ARA again.

On the other hand, when the aggressor row address ARA has not been stored in the queue 630 (e.g., when the queue 630 is empty) at the timing of the targeted refresh command F-REF at S765, the control circuit 620 may detect the aggressor row address ARA based on the counted values of the row addresses at the timing of the targeted refresh command F-REF at S780, and determine the victim row address VRA based on the aggressor row address ARA and output the victim row address VRA at S790. In some embodiments, the control circuit 620 may detect a row address having a largest count value at the timing of the targeted refresh command F-REF as the aggressor row address ARA.

A memory device may refresh a row indicated by the victim row address VRA in the memory cell array at S795.

Figure 8:
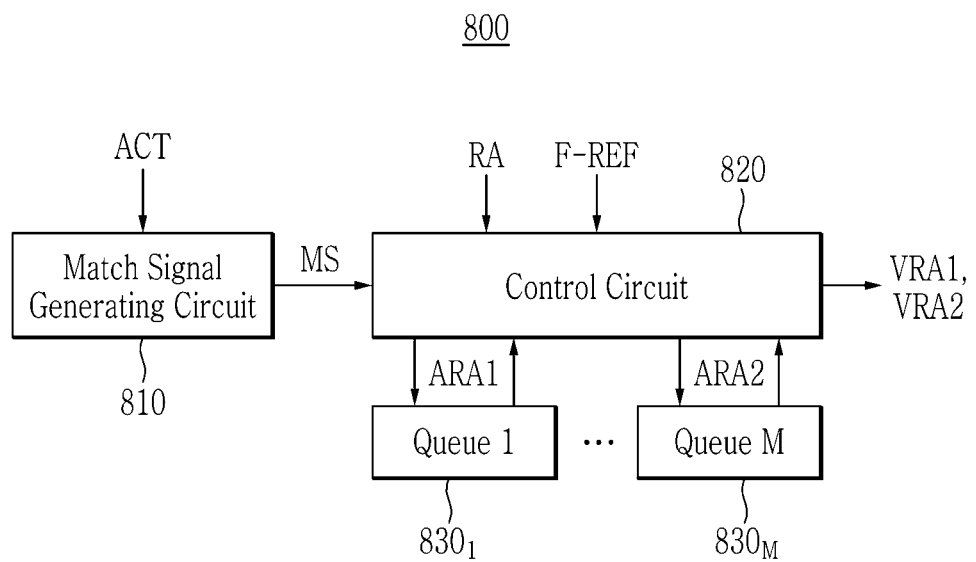
FIG. 8 is an example block diagram illustrating a refresh control circuit of a memory device according to some embodiments.

FIG. 8 is an example block diagram showing a refresh control circuit according to some embodiments. In some embodiments, a refresh control circuit 800 shown in FIG. 8 may correspond to a targeted refresh control circuit (e.g., 291 in FIG. 2).

Referring to FIG. 8, the refresh control circuit 800 may include a match signal generating circuit 810, a control circuit 820, and a plurality of queues $830_1$-$830_m$ (sometimes referred to individually as individual queues). Here, M is an integer greater than or equal to two. In some embodiments, the match signal generating circuit 810 may include a random sequence generator and a comparing circuit as described with reference to FIG. 6. In some embodiments, the control circuit 820 may include a plurality of registers as described with reference to FIG. 5 or FIG. 6.

The control circuit 820 may detect an aggressor row address ARA1 when receiving a match signal MS from the match signal generating circuit 810 and store the aggressor row address ARA1 in one of the queues $830_1$-$830_M$. Upon receiving an additional match signal MS before receiving a targeted refresh command F-REF after receiving the match signal MS, the control circuit 820 may detect an aggressor row address ARA2 at a timing of the additional match signal MS, and store the aggressor row address ARA2 may be stored in another empty queue among the queues $830_1$-$830_M$. In this way, when receiving the match signal MS a plurality of times before receiving the targeted refresh command F-REF, the control circuit 820 may detect the aggressor row address at the timing of each match signal MS, and store the detected aggressor row address in an empty queue. In some embodiments, when receiving the match signal MS the plurality of times that are more than the number of queues $830_1$-$830_m$ before receiving the targeted refresh command F-REF, the control circuit 820 may ignore the match signal MS after all the queues $830_1$-$830_m$ become full. For example, if M queues $830_1$-$830_m$ are provided, the control circuit 820 may ignore the $(M+1)^{th}$ and subsequent match signals MS and not detect the aggressor row address ARA.

The control circuit 820 may determine victim row addresses VRA1 and VRA2 based on aggressor row addresses ARA1 and ARA2 stored in the queues $830_1$-$830_m$, respectively, and output the victim row addresses VRA1 and VRA2 at the timing of the targeted refresh command F-REF.

In this way, the refresh control circuit 800 may use the queues $830_1$-$830_m$ thereby quickly responding to an attack pattern that may occur after the first match signal MS.

Figure 9:
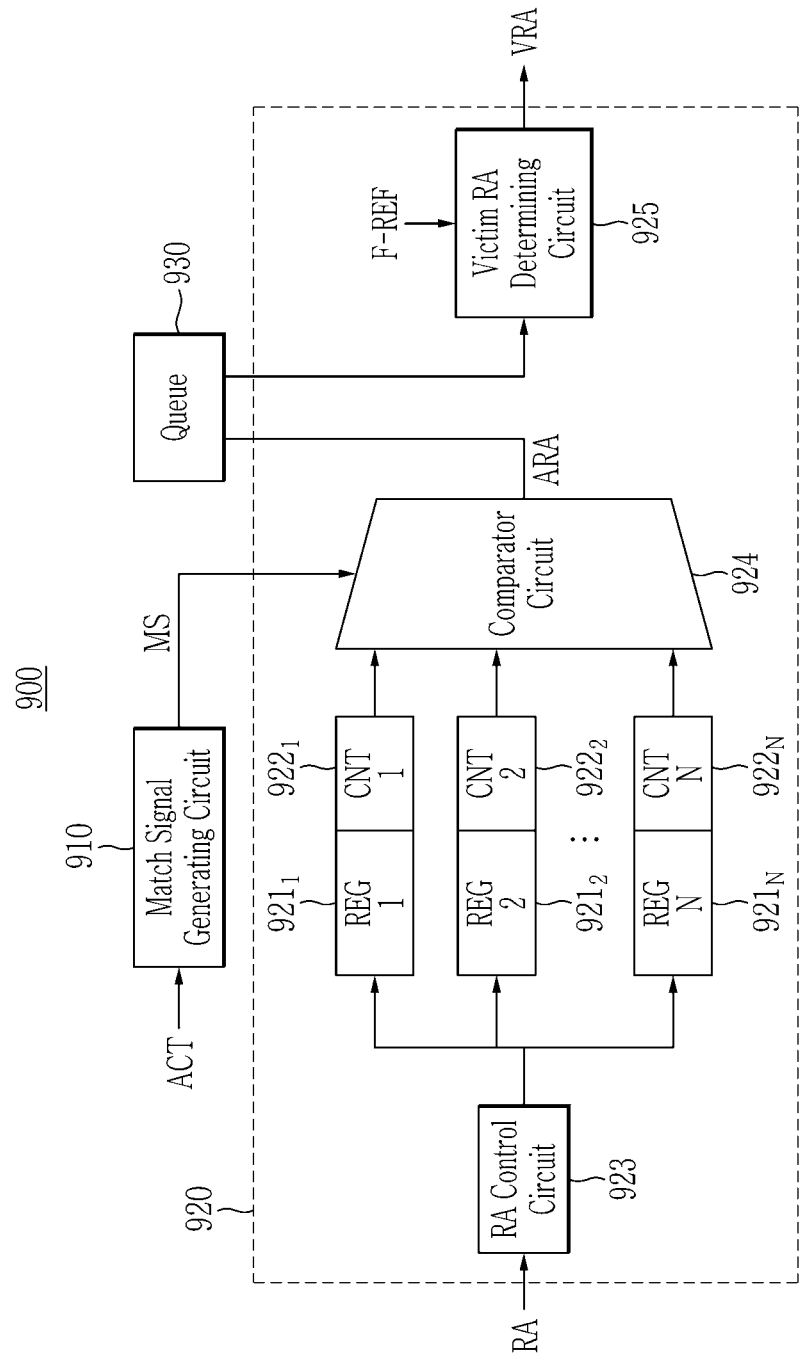
FIG. 9 is an example block diagram illustrating a refresh control circuit of a memory device according to some embodiments.

FIG. 9 is an example block diagram showing a refresh control circuit according to some embodiments. In some embodiments, a refresh control circuit 900 shown in FIG. 9 may correspond to a targeted refresh control circuit (e.g., 291 in FIG. 2).

Referring to FIG. 9, the refresh control circuit 900 may include a match signal generating circuit 910, a control circuit 920, and a queue 930. The match signal generating circuit 910 may include a random sequence generator and a comparing circuit as described with reference to FIG. 6.

The control circuit 920 may include a plurality of registers $921_1$, $921_2$, ... $921_N$, a plurality of counters $922_1$, $922_2$, ... $922_N$, a row address control circuit 923, a comparing circuit 924, and a victim row address determining circuit 925.

Each of the registers $921_1$-$921_N$ may store an incoming row address RA. The counters $922_1$-$922_N$ may correspond to the registers $921_1$-$921_N$, respectively, and each of the counters $922_1$-$922_N$ may count the number of hits for the incoming row address RA in a corresponding one of the registers $921_1$-$921_N$. The row address control circuit 923 may receive the incoming row address RA and control the registers $921_1$-$921_N$ and the counters $922_1$-$922_N$. The row address control circuit 923 may determine whether there is a register in which the incoming row address RA hits among the registers $921_1$-$921_N$. The row address control circuit 923 may determine a register to be replaced when neither a register in which the incoming row address RA hits, nor an empty register exists among the registers $921_1$-$921_N$.

The comparing circuit 924 may compare count values of the counters $922_1$-$922_N$ at a timing of a match signal MS, detect a row address (e.g., an aggressor row address) ARA stored in a register having a largest count value among the registers $921_1$-$921_N$, and store the aggressor row address ARA in the queue 930. The victim row address determining circuit 925 may determine a victim row address VRA based on the aggressor row address ARA stored in the queue 930, and output the victim row address VRA at a timing of a targeted refresh command F-REF.

Figure 10:
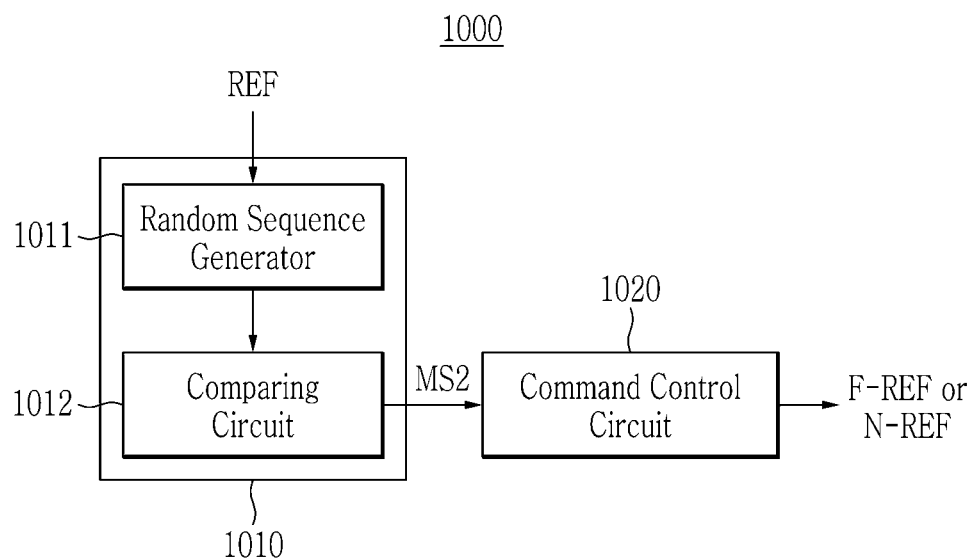
FIG. 10 is an example block diagram illustrating a refresh control circuit of a memory device according to some embodiments.
Figure 11:
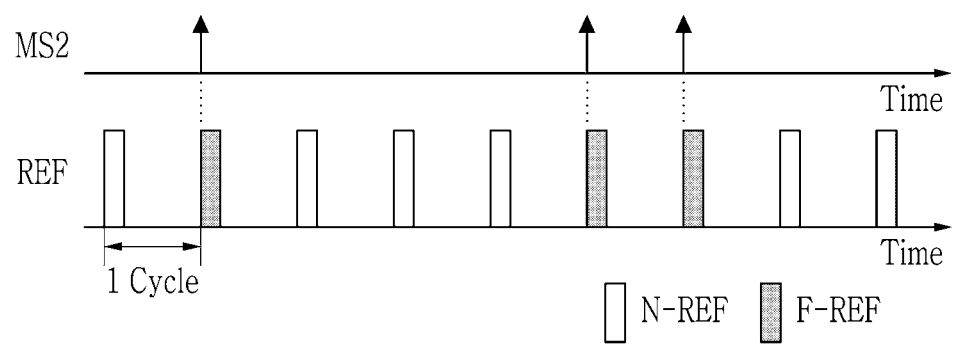
FIG. 11 is an example drawing showing an operation of a refresh control circuit shown in FIG. 10.

FIG. 10 is an example block diagram showing a refresh control circuit according to some embodiments, and FIG. 11 is an example drawing showing an operation of a refresh control circuit shown in FIG. 10. In some embodiments, a refresh control circuit 1000 shown in FIG. 10 and FIG. 11 may correspond to a refresh control circuit 290 shown in FIG. 2.

Referring to FIG. 10, the refresh control circuit 1000 may include a match signal generating circuit 1010, and a command control circuit 1020.

The match signal generating circuit 1010 may randomly generate a match signal MS2. In some embodiments, the match signal generating circuit 1010 may determine whether to generate the match signal MS2 in response to a predetermined command received from a memory controller (e.g., 110 in FIG. 1). In some embodiments, the predetermined command may be a refresh command REF. In some embodiments, when the refresh command REF is received a first predetermined number of times, the match signal MS2 may be randomly generated a second predetermined number of times. For example, when the refresh command REF is received three times, the match signal MS2 may be randomly generated once.

In some embodiments, the match signal generating circuit 1010 may include a random sequence generator 1011 and a comparing circuit 1012. The random sequence generator 1011 may generate a random code. The random code may include a random number or pseudo-random number. In some embodiments, the random code may be a pseudo-random pre-sequence. For example, the random sequence generator 1011 may be implemented as linear-feedback shift registers. In some embodiments, when receiving the refresh command REF from the memory controller 120, the random sequence generator 1011 may generate the random code in response to the refresh command REF. The comparing circuit 1012 may compare the random code generated by the random sequence generator 1011 with a predetermined code (e.g., a predetermined binary code), and output the match signal MS2 when the random code matches (e.g., is the same as) the predetermined code. For example, if the random code does not match, the match signal MS2 may not be generated and/or output. In some embodiments, when the refresh command REF is received the first predetermined number of times, the match signal MS2 matching the predetermined code may be randomly generated the second predetermined number of times.

The command control circuit 1020 may randomly output a normal refresh command N-REF and a targeted refresh command F-REF based on the match signal MS2. In some embodiments, the command control circuit 1020 may output the targeted refresh command F-REF in response to the refresh command REF at a timing of the match signal MS2 (e.g., in response to the match signal MS2), and output the normal refresh command N-REF in response to the refresh command REF at a timing other than the timing of the match signal MS2. For example, the command control circuit 1020 can periodically (e.g., once per cycle) output a refresh command. If the command control circuit 1020 receives the match signal MS2, the targeted refresh command F-REF may be output. If the command control circuit 1020 does not receive the match signal MS2, the normal refresh command N-REF may be output.

In some embodiments, the command control circuit 1020 may randomly output the targeted refresh command F-REF as many times as the second predetermined number of times when the refresh command REF is received the first predetermined number of times. That is, the command control circuit 1020 randomly determine a refresh cycle for using the targeted refresh command F-REF from among the first predetermined number of refresh cycles, and use the normal refresh command N-REF in a refresh cycle other than the refresh cycle for using the targeted refresh command F-REF. For example, as shown in FIG. 11, the targeted refresh command F-REF may be randomly generated once and the normal refresh command N-REF may be generated twice, among the three refresh cycles.

For example, if the targeted refresh command F-REF and the normal refresh command N-REF occur regularly, a memory device may be vulnerable to an attack pattern that is input in synchronization with the normal refresh command N-REF. According to the above-described embodiments, since the targeted refresh command F-REF is randomly generated, it is possible to respond to the attack pattern that is input in synchronization with the refresh command REF.

As described above in reference to FIG. 3, the match signal generating circuit 1010 and command control circuit 1020 are examples of circuit(s) configured to randomly provide a normal refresh command or a targeted refresh command to provide for targeted refresh commands being generated/provided at random times, and other methods and combinations of circuit(s) are also within the scope of this disclosure. For example, in some embodiments, a random timing generation circuit (of which the match signal generating circuit 1010 is an example) includes a random sequence generation circuit (of which the random sequence generator 1011 is an example) and a comparison circuit (of which the comparing circuit 1010 is an example). If the random code output by the random timing generation circuit satisfies a condition (of which the matching condition described above is an example), the random timing generation circuit (e.g., the comparison circuit) is configured to generate and/or output a targeted refresh timing signal (of which MS2 is an example). Accordingly, the targeted refresh timing signal is generated and/or output at a random time. The command control circuit 1020 can determine whether to output the targeted refresh command or the normal refresh command based on the targeted refresh timing signal (e.g., based on whether or not the targeted refresh timing signal is received). Accordingly, whether a targeted refresh operation or a normal refresh operation is performed is randomly determined.

Figure 12:
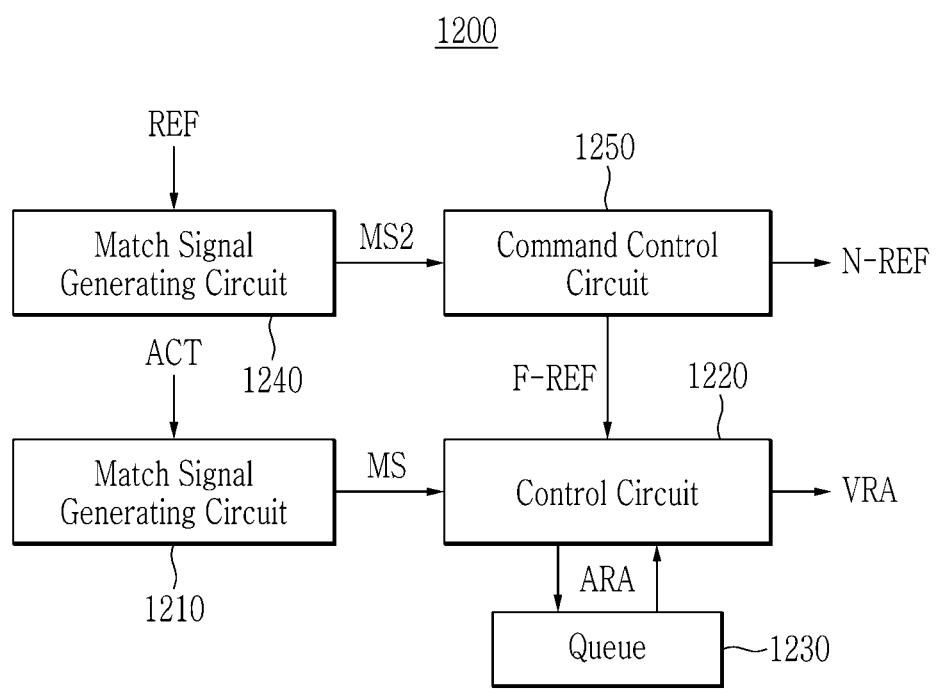
FIG. 12 is an example block diagram illustrating a refresh control circuit of a memory device according to some embodiments.
Figure 13:
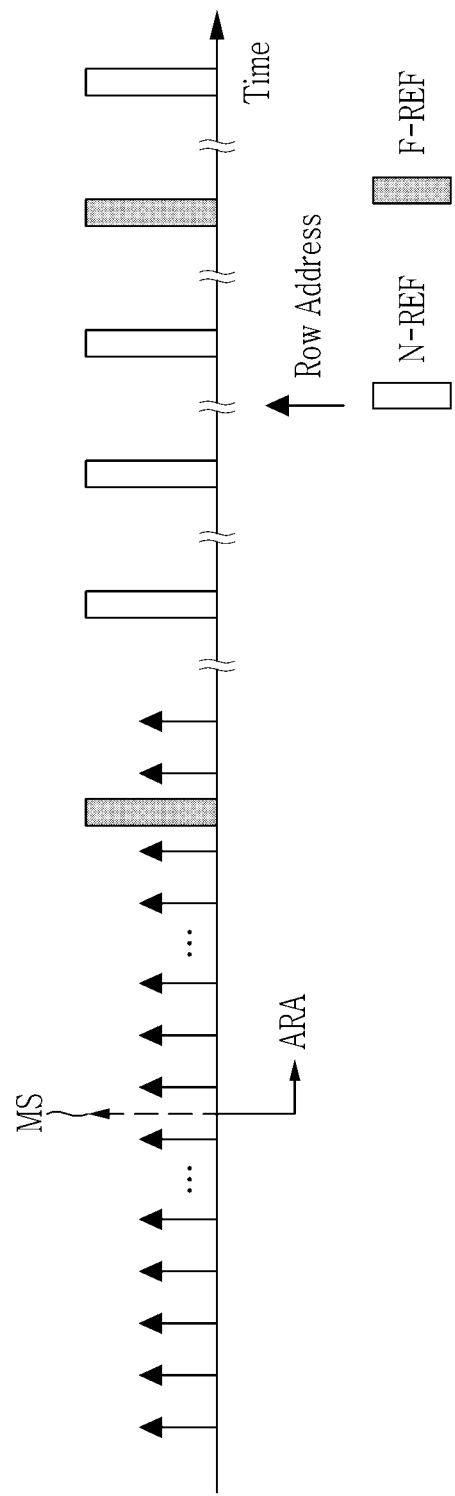
FIG. 13 is an example drawing showing an operation of a refresh control circuit shown in FIG. 12.

FIG. 12 is an example block diagram showing a refresh control circuit according to some embodiments, and FIG. 13 is an example drawing showing an operation of a refresh control circuit shown in FIG. 12. In some embodiments, a refresh control circuit 1200 shown in FIG. 12 and FIG. 13 may correspond to a refresh control circuit 290 shown in FIG. 2.

Referring to FIG. 12, the refresh control circuit 1200 may include a match signal generating circuit 1210, a control circuit 1220, a queue 1230, a match signal generating circuit 1240, and a command control circuit 1250.

The match signal generating circuit 1210 may randomly generate a first match signal MS. In some embodiments, the match signal generating circuit 1210 may generate a first random code in response to an activate command ACT, and may generate the first match signal MS when the first random code matches (e.g., is the same as) a first predetermined code.

The control circuit 1220 may detect an aggressor row address ARA at a timing of the first match signal MS, and store the aggressor row address ARA in the queue 1230. The control circuit 1220 may control a refresh based on the aggressor row address ARA stored in the queue 1230 at a timing of a targeted refresh command F-REF.

The match signal generating circuit 1240 may randomly generate a second match signal MS2. In some embodiments, the match signal generating circuit 1240 may generate a second random code in response to a refresh command REF, and generate a second match signal MS2 when the second random code matches (e.g., is the same as) a second predetermined code.

The command control circuit 1250 may output the targeted refresh command F-REF to the control circuit 1220 based on the refresh command REF in response to the second match signal MS2. The command control circuit 1250 may output a normal refresh command N-REF based on the refresh command REF when the second match signal MS2 is not generated.

Therefore, as shown in FIG. 13, the targeted refresh command F-REF may randomly occur, and the normal refresh command N-REF may occur in a refresh cycle in which the targeted refresh command F-REF does not occur. Further, when the targeted refresh command F-REF is generated, the refresh may be performed based on the aggressor row address ARA stored in the queue 1230.

Figure 14:
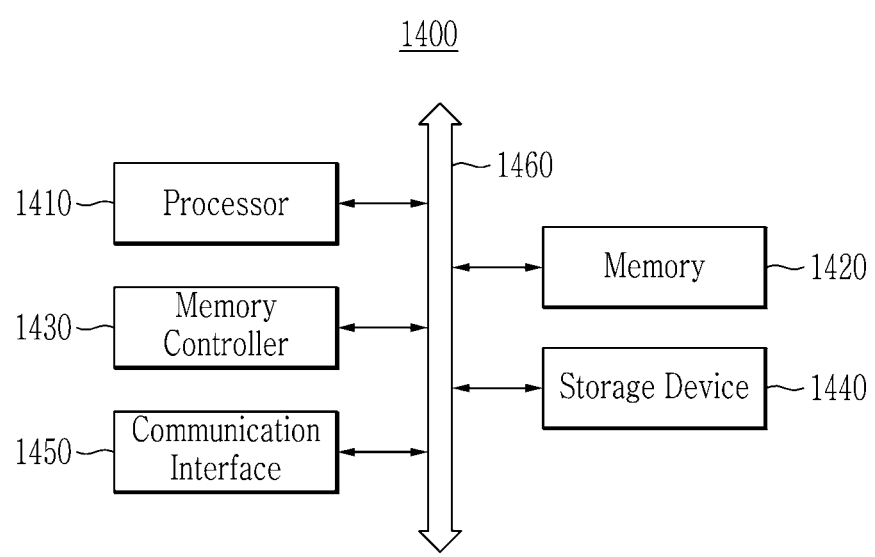
FIG. 14 is an example block diagram showing a computer device according to some embodiments.

FIG. 14 is an example block diagram showing a computer device according to some embodiments.

Referring to FIG. 14, a computing device 1400 includes a processor 1410, a memory 1420, a memory controller 1430, a storage device 1440, a communication interface 1450, and a bus 1460. The computing device 1400 may further include other components.

The processor 1410 may control an overall operation of each component of the computing device 1400. The processor 1410 may be implemented with at least one of various processing units such as a central processing unit (CPU), an application processor (AP), and a graphic processing unit (GPU).

The memory 1420 may store various data and instructions. The memory 1420 may be implemented with the memory device described with reference to FIG. 1 to FIG. 13. The memory controller 1430 may control transfers of data or instructions to and from the memory 1420. The memory controller 1430 may be implemented with the memory controller described with reference to FIG. 1 to FIG. 13. In some embodiments, the memory controller 1430 may be provided as a separate chip from the processor 1410. In some embodiments, the memory controller 1430 may be provided as an internal component of the processor 1410.

The storage device 1440 may non-temporarily store programs and data. In some embodiments, the storage device 1440 may be implemented a non-volatile memory. The communication interface 1450 may support wired or wireless Internet communication of the computing device 1400. In addition, the communication interface 1450 may support various communication methods other than Internet communication. The bus 1460 provides a communication function between the component of the computing device 1400. The bus 1460 may include at least one type of bus according to a communication protocol between the components.

In some embodiments, each of the components, elements, modules, or units represented by a block as illustrated in FIG. 1 to FIG. 13 may be implemented as various numbers of hardware, software, and/or firmware structures that execute respective functions described above, according to embodiments. For example, at least one of these components, elements, modules, or units may include various hardware components including a digital circuit, a programmable or non-programmable logic device or array, an application specific integrated circuit (ASIC), or other circuitry using a digital circuit structure, such as a memory, a processor, a logic circuit, a look-up table, etc., that may execute the respective functions through controls of one or more microprocessors or other control apparatuses. Further, at least one of these components, elements, modules, or units may include a module, a program, or a part of code, which contains one or more executable instructions for performing specified logic functions, and executed by one or more microprocessors or other control apparatuses. Furthermore, at least one of these components, elements, modules, or units may further include or may be implemented by a processor such as a central processing unit (CPU) that performs the respective functions, a microprocessor, or the like. Functional aspects of embodiments may be implemented in algorithms that execute on one or more processors.

While various practical embodiments have been described, it is to be understood that the scope of this disclosure and the following claims is not limited to the disclosed embodiments. For example, although some described embodiments describe operations as being performed by one or more circuits of a memory device (e.g., by a control circuit), in some embodiments, at least some of the operations (such as operations described in reference to FIGS. 1-13, including operations described in reference to FIG. 7) can be performed by a memory controller, such as memory controller 120. On the contrary, it is intended to cover various modifications and equivalent arrangements included within the spirit and scope of the appended claims.

What is claimed is:

1. A memory device comprising:
a memory cell array comprising a plurality of rows;
a queue; and
a control circuit configured to:
at a random time, determine an aggressor row address, the aggressor row address indicating an aggressor row among the plurality of rows;
store the aggressor row address or a value derived from the aggressor row address in the queue; and
in response to a first targeted refresh command, control a refresh operation of one or more victim rows of the plurality of rows based on the aggressor row address.

2. The memory device of claim 1, comprising a random timing generation circuit comprising:
a random sequence generation circuit configured to generate a random code; and
a comparison circuit configured to
determine whether the random code satisfies a condition, and
in response to determining that the random code satisfies the condition, output a detection timing signal to the control circuit,
wherein the control circuit is configured to determine the aggressor row address at a timing of the detection timing signal.

3. The memory device of claim 2, wherein the random sequence generation circuit is configured to generate the random code in response to receiving an activate command for activating a target row among the plurality of rows.

4. The memory device of claim 3, wherein the random code comprises a pseudo-random sequence.

5. The memory device of claim 1, wherein the control circuit is further configured to empty the queue in response to the first targeted refresh command.

6. The memory device of claim 1, wherein the queue comprises a plurality of queues, and
wherein the control circuit is further configured to:
at each of a plurality of random times before receiving the first targeted refresh command,
determine a corresponding aggressor row address, and
store the corresponding aggressor row address or a value derived from the corresponding aggressor row address in an empty queue of the plurality of queues.

7. The memory device of claim 1, wherein the control circuit is further configured to, in response to receiving a second targeted refresh command after the first targeted refresh command, the second targeted refresh command received without a second aggressor row address being determined after the first targeted refresh command and before the second targeted refresh command:
determine the second aggressor row address at a timing of the second targeted refresh command.

8. The memory device of claim 1, further comprising a command control circuit configured to randomly determine a first refresh cycle corresponding to the first targeted refresh command from among a plurality of refresh cycles.

9. The memory device of claim 8, wherein the plurality of refresh cycles comprises a predetermined number of refresh cycles, and
wherein the command control circuit is configured to provide a normal refresh command in a second refresh cycle, different from the first refresh cycle, among the predetermined number of refresh cycles.

10. The memory device of claim 8, wherein the command control circuit comprises:
a second random timing generation circuit configured to generate a targeted refresh timing signal at a second random time; and
a second control circuit configured to determine the first refresh cycle in response to the targeted refresh timing signal.

11. The memory device of claim 10, wherein the second random timing generation circuit comprises:
a second random sequence generation circuit configured to generate a second random code in response to receiving a refresh command; and
a comparison circuit configured to
determine whether the second random code satisfies a condition, and
in response to determining that the second random code satisfies the condition, output the targeted refresh timing signal.

12. The memory device of claim 1, wherein the control circuit is further configured to:
count incoming row addresses corresponding to two or more rows of the plurality of rows;
at the random time, determine a row address having a largest count value among the two or more rows as the aggressor row address; and
continue to count incoming row addresses that are input after the random time.

13. The memory device of claim 1, wherein the control circuit is configured to output one or more victim row addresses of the one or more victim rows in response to the first targeted refresh command.

14. The memory device of claim 1, wherein the control circuit comprises a plurality of registers, each register of the plurality of registers configured to store a row address, and wherein the control circuit is further configured to:
in response to receiving a first incoming row address, increase a count value of a first register, of the plurality of registers, that stores the first incoming row address; and
determine a row address stored in a register having a largest count value among the plurality of registers as the aggressor row address.

15. The memory device of claim 14, wherein the control circuit is further configured to:
in response to receiving a second incoming row address that is not stored in any of the plurality of registers, and based on the plurality of registers not including an empty register, store the second incoming row address in a second register having a smallest count value among the plurality of registers; and
increase a count value of the second register.

16. A memory device comprising:
a memory cell array comprising a plurality of rows;
a random timing generation circuit configured to generate a targeted refresh timing signal at a random time; and
a command control circuit configured to output, based on the targeted refresh timing signal,
a normal refresh command for a normal refresh operation, or
a targeted refresh command for a refresh operation of a row indicated by a victim row address among the plurality of rows.

17. The memory device of claim 16, wherein the command control circuit is configured to output the normal refresh command in response to not receiving the targeted refresh timing signal, and to output the targeted refresh command in response to receiving the targeted refresh timing signal.

18. The memory device of claim 17, wherein the random timing generation circuit comprises:
a random sequence generation circuit configured to generate a random code in response to receiving a refresh command; and
a comparison circuit configured to:
determine whether the random code satisfies a condition, and
in response to determining that the random code satisfies the condition, output the targeted refresh timing signal.

19. A refresh method of a memory device including a memory cell array including a plurality of rows, the refresh method comprising:
determining a random time;
at the random time, determining an aggressor row address indicating an aggressor row from among the plurality of rows;
storing the aggressor row address or a value derived from the aggressor row address in a queue;
determining a victim row address based on the aggressor row address; and
in response to receiving a refresh command, refreshing a victim row indicated by the victim row address.

20. The refresh method of claim 19, further comprising:
counting incoming row addresses corresponding to two or more rows of the plurality of rows;
at the random time, determining a row address having a largest count value among the two or more rows as the aggressor row address; and
continuing to count incoming row addresses that are input after the random time and before receiving the refresh command.

* * * * *